(12) United States Patent
Pei

(10) Patent No.: US 8,246,795 B2
(45) Date of Patent: Aug. 21, 2012

(54) LENS MODULE FABRICATION METHOD

(75) Inventor: Shao-Kai Pei, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 332 days.

(21) Appl. No.: 12/763,128

(22) Filed: Apr. 19, 2010

(65) Prior Publication Data

US 2011/0155562 A1   Jun. 30, 2011

(30) Foreign Application Priority Data

Dec. 25, 2009  (TW) .............................. 98144910 A

(51) Int. Cl.
*C23C 14/00*  (2006.01)
*C23C 14/32*  (2006.01)
(52) U.S. Cl. ................................... 204/192.26; 427/162
(58) Field of Classification Search ............. 204/192.26; 427/162

See application file for complete search history.

(56) References Cited

U.S. PATENT DOCUMENTS

2007/0019102 A1 * 1/2007 Nakajo et al. ................. 348/340

* cited by examiner

*Primary Examiner* — Luan Van
*Assistant Examiner* — Ibrahime A Abraham
(74) *Attorney, Agent, or Firm* — Altis Law Group, Inc.

(57) ABSTRACT

A method for fabricating a lens module includes forming an IR-cut filter, forming a shading block on part of a surface of the IR-cut filter, forming a blocking layer on the IR-cut filter and the shading block, forming an electromagnetic shielding layer on the blocking layer, polishing the electromagnetic shielding layer and the blocking layer to expose the shading block, removing the shading block from the IR-cut filter to form an optical component, mounting a lens in the barrel portion adjacent to the IR-cut filter portion, and packaging the holding portion of the optical component to a printed circuit board to form the lens module.

11 Claims, 9 Drawing Sheets

LENS MODULE FABRICATION METHOD

TECHNICAL FIELD

The present disclosure relates generally to a lens module fabrication method.

DESCRIPTION OF RELATED ART

With rapid developments in electronic technology, various mobile electronic devices such as mobile phones, personal digital assistants, and other devices are recently provided with an image capture feature provided by a camera module mounted therein.

A conventional camera module often includes a lens module and an image sensor chip received in the lens module. The lens module includes a holder, a barrel threaded in the holder, and a lens with an IR-cut filter received in the barrel. However, because the lens, the barrel, and the holder are separately manufactured and then assembled, minimization of the lens module profile is difficult, and fabrication is complicated.

Thus, a fabrication method of a lens module which overcomes the described limitations is desired.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
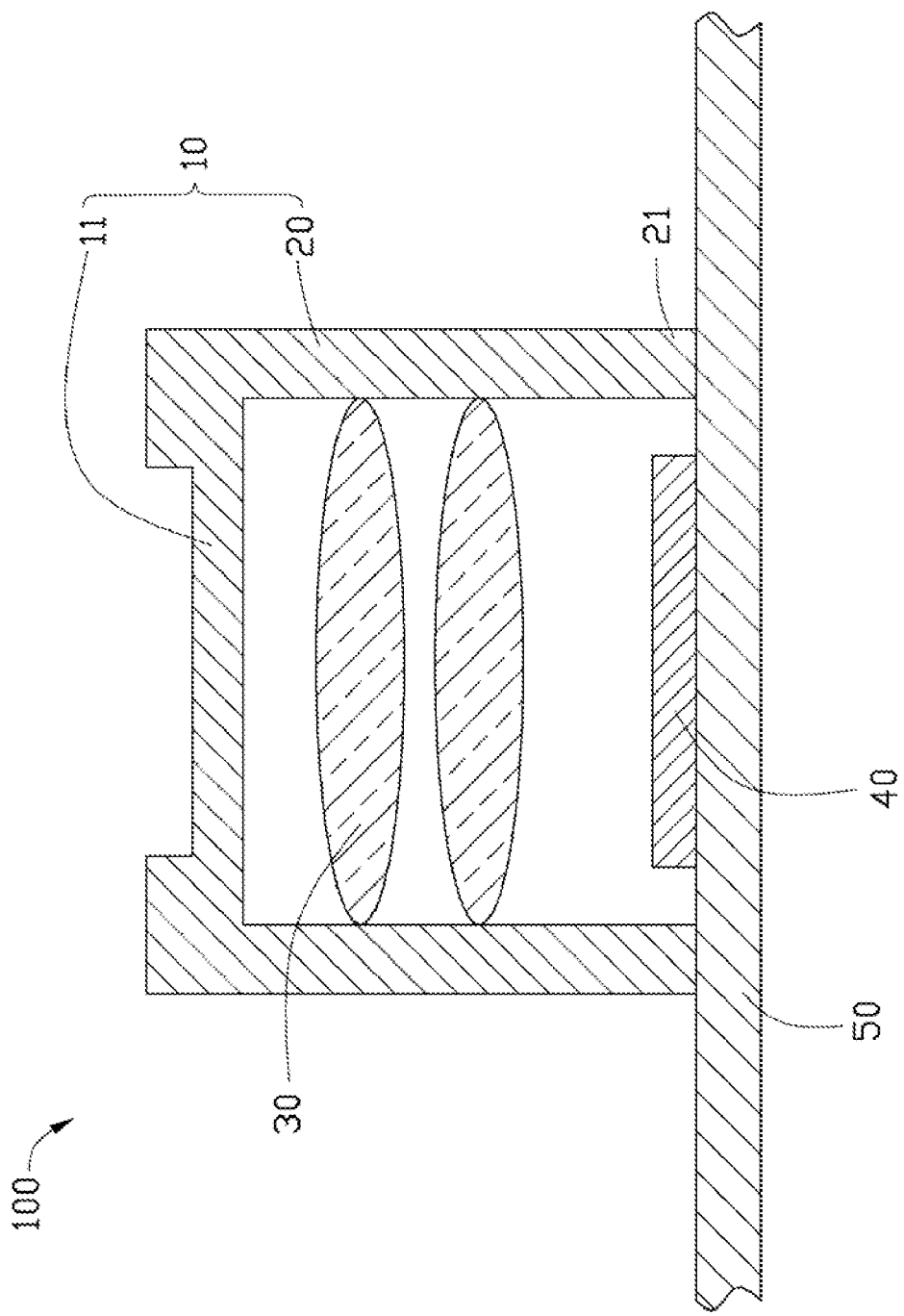
FIG. 1 is a schematic, cross-section of one embodiment of a lens module fabricated using one embodiment of a lens module fabrication method as disclosed.

Referring to FIG. 1, one embodiment of a lens module 100 fabricated using one embodiment of a lens module fabrication method as disclosed includes an optical component 10, a lens set 30, and a printed circuit board (PCB) 50. The optical component 10 includes an infrared-cut (IR-cut) filter portion 11 and a barrel portion 20. The IR-cut filter portion 11 is integrally formed on an end of the barrel portion 20. The lens set 30 is received in the barrel portion 20 and positioned on an inner side of the IR-cut filter portion 11. The barrel portion 20 includes an end 21 fixed on a top surface of the PCB 50 away from the IR-cut filter portion 11.

The IR-cut filter portion 11 is configured to block near infrared light while allowing visible light to pass to increase the reproduction ability of lens module 100.

The lens set 30 is configured to correct aberration and distortion of the lens module 100 for better imaging quality. In the illustrated embodiment, the lens set 30 includes two convex lenses.

The lens module 100 further includes an image sensor chip 40 mounted on a top surface of the PCB 50, and disposed on a side of the lens set 30. The image sensor chip 40, configured to convert optical image signals of an object into electronic signals, may be a charge-coupled device (CCD), a complementary metal-oxide semiconductor (CMOS), and so on. In the illustrated embodiment, the image sensor chip 40 is packaged on the PCB 50 through a ceramic leaded chip carrier (CLCC) packaging process. The PCB 50 is a flexible print circuit (FPC).

Figure 2:
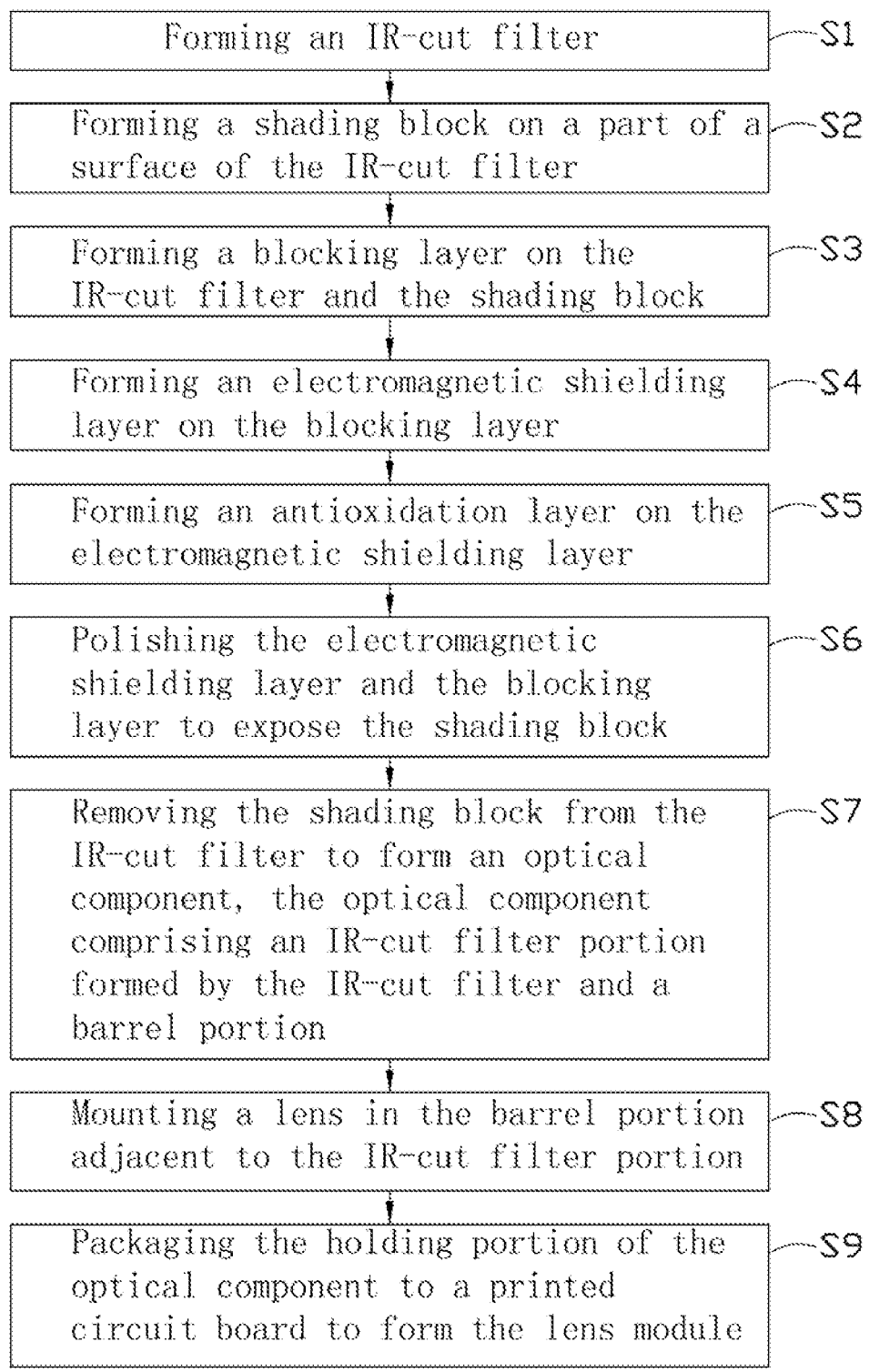
FIG. 2 is a flowchart of the lens module fabrication method utilized in FIG. 1. <Step S1, forming is spelled incorrectly
Figure 3:
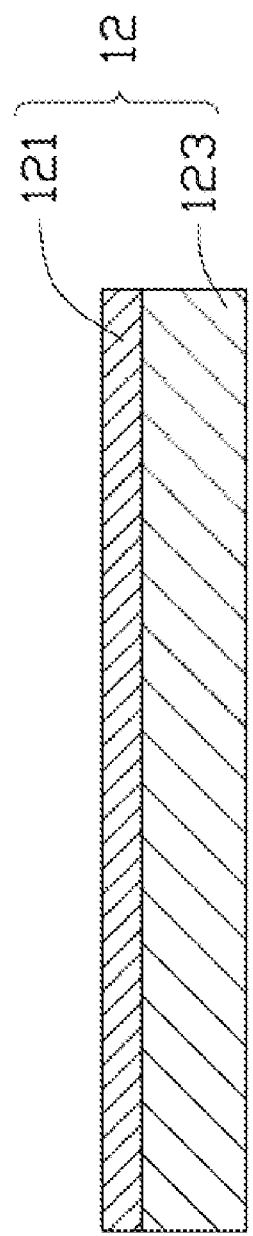
FIG. 3 through FIG. 9 are schematic partial cross-sections of at least a part of the lens module of FIG. 1, with each of FIG. 3 through FIG. 9 relating to at least one step of the method of FIG. 2.

Referring to FIG. 2, an embodiment of a method for fabricating a lens module is described as follows:

In step S1, referring to FIG. 3, an IR-cut filter 12 is formed. In the illustrated embodiment, an IR-cut film 123 is deposited, such as by evaporation plating, on a surface of transparent substrate 121, such as glass, to form the IR-cut filter 12. In alternative embodiments, the IR-cut filter 12 may be formed by depositing the IR-cut film 123 on a surface of each transparent substrate 121, and then fixing a plurality of transparent substrates 121 together by, for example, ultraviolet (UV) adhesive.

Figure 4:
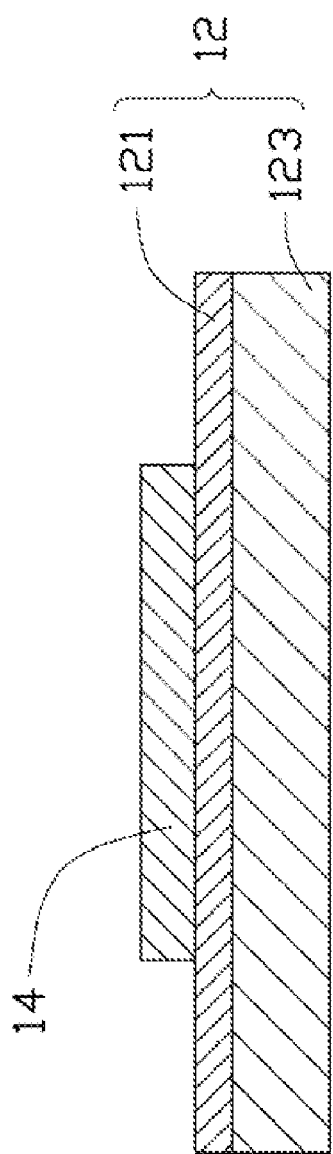

In step S2, referring to FIG. 4, a shading block 14 is formed on a part of the IR-cut filter 12. The shading block 14 can consist essentially of aluminophosphate and silica. In this embodiment, a plurality of droplets of ceramic powder in a liquid phase containing aluminophosphate, silica, and water are discharged on a part of the surface of the IR-cut filter 12. The droplets are then dried by means of heating to form the shading block 14. The shading block 14 is substantially round, and has a diameter of 1 mm. It is to be understood that, the shading block 14 may be other materials, which can be easily removed from the IR-cut filter 12.

Figure 5:
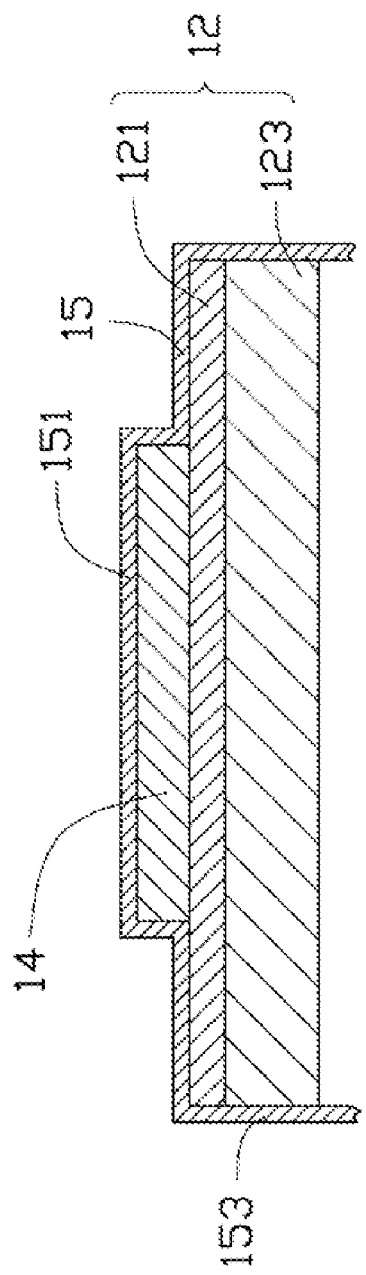

In step S3, referring to FIG. 5, a blocking layer 15 is formed on the IR-cut filter 12 and the shading block 14. The blocking layer 15 is configured to prevent unnecessary light from entering the lens module 100. In the illustrated embodiment, a chromium nitride (CrN) layer, which is hard, inert, and abrasion-resistant, is sputter deposited on the IR-cut filter 12 and the shading block 14 to form the blocking layer 15. The blocking layer 15 includes a first protruding portion 151 located in the shading block 14, and a first surrounding portion 153 surrounding the IR-cut filter 12.

Figure 6:
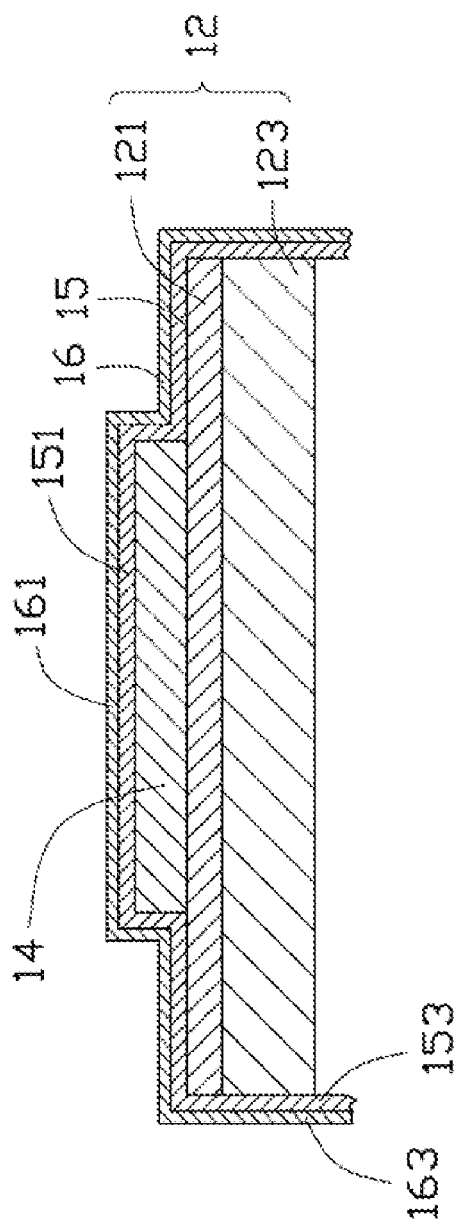

In step S4, referring to FIG. 6, an electromagnetic shielding layer 16 is formed on the blocking layer 15. The electromagnetic shielding layer 16 is configured to prevent external electromagnetic radiation from reaching the image sensor chip 40, thus ensuring a satisfactory visibility of images. In the illustrated embodiment, a copper layer is sputter deposited on the blocking layer 15 to form the electromagnetic shielding layer 16. The electromagnetic shielding layer 16 includes a second protruding portion 161 located in the first protruding portion 151, and a second surrounding portion 163 formed on the first surrounding portion 153. It is to be understood that the electromagnetic shielding layer 16 may contain other high conductive metal, such as aluminum.

Figure 7:
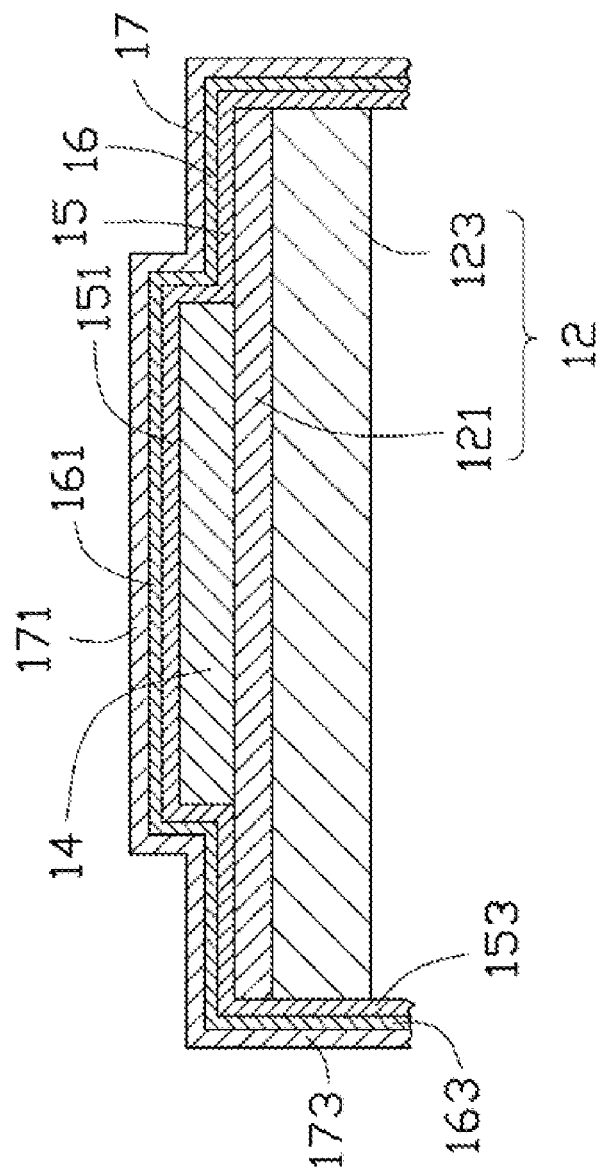

In step S5, referring to FIG. 7, an anti-oxidation layer 17 is formed on the electromagnetic shielding layer 16. The anti-oxidation layer 17 is configured to prevent the electromagnetic shielding layer 16 from contacting the atmosphere directly. In the illustrated embodiment, a stainless steel layer is sputter deposited on the electromagnetic shielding layer 16 to form the anti-oxidation layer 17. The anti-oxidation layer 17 includes a third protruding portion 171 located in the second protruding portion 161, and a third surrounding portion 173 formed on the second surrounding portion 163. It is to be understood that the anti-oxidation layer 17 may be omitted.

Figure 8:
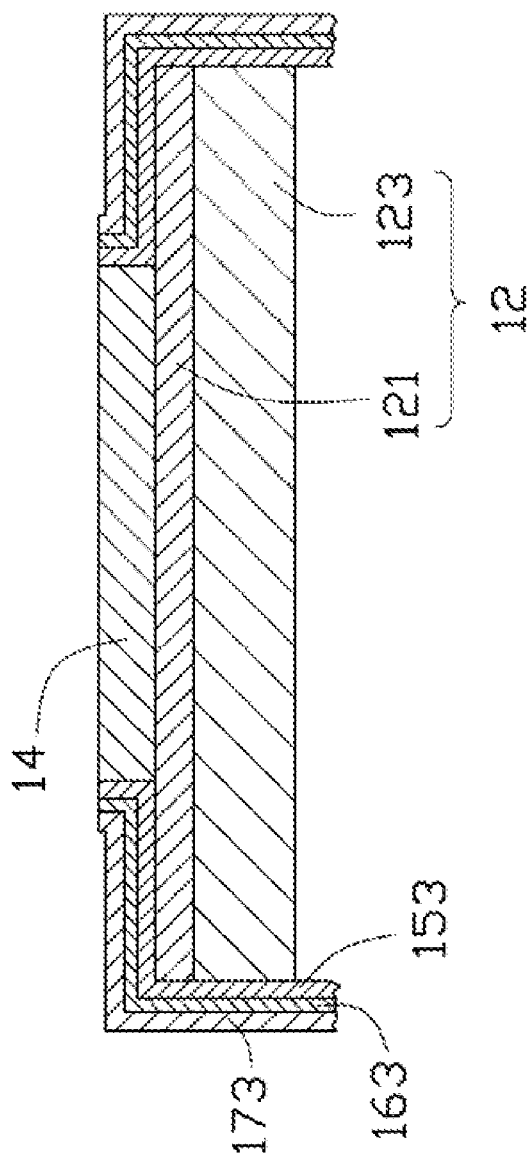

In step S6, referring to FIG. 8, the third protruding portion 171, the second protruding portion 161, and the first protruding portion 151 are polished in that order, such that a surface of the shading block 14 is exposed. In the illustrated embodiment, the third protruding portion 171, the second protruding portion 161, and the first protruding portion 151 undergo chemical mechanical polishing (CMP).

Figure 9:
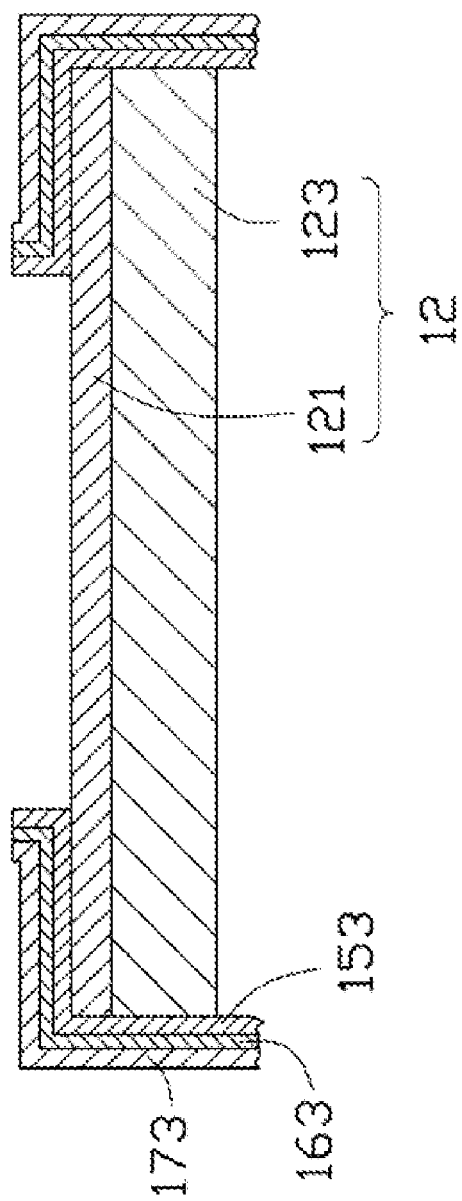

In step S7, referring to FIG. 9, the shading block 14 is removed from the IR-cut filter 12, and the optical component 10 is formed. In the illustrated embodiment, the shading block 14 is dissolved and washed away using water or other solvents, such that the IR-cut filter 12 formerly beneath the shading block 14 is exposed. The optical component 10 includes the IR-cut filter portion 11 formed by the IR-cut filter 12 and the barrel portion 20 cooperatively formed by the first surrounding portion 153, the second surrounding portion 163, and the third surrounding portion 173.

In step S8, referring to FIG. 1 again, the lens set 30 is received in the barrel portion 20 and positioned on a side of the IR-cut filter portion 11.

In step S9, the end 21 of the barrel portion 20 is located on the top surface of the PCB 50, and the lens set 30 is aligned with the image sensor chip 40. The fabrication of the lens module 100 is completed.

The lens module 100 includes an integrally formed IR-cut filter portion 11 and barrel portion 20, such that it is easily assembled. In addition, the barrel portion 20 is formed by depositing a plurality of layers on the IR-cut filter 12, such that the shape and the thickness of the barrel portion 20 can be precisely controlled, and the size and profile of the lens module 100 can be minimized.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A method for fabricating a lens module, comprising:
   forming an IR-cut filter;
   forming a shading block on a part of a surface of the IR-cut filter;
   forming a blocking layer on the IR-cut filter and the shading block, the blocking layer comprising a first surrounding portion surrounding the IR-cut filter and a first protruding portion located in the shading block;
   forming an electromagnetic shielding layer on the blocking layer, the electromagnetic shielding layer comprising a second surrounding portion formed on the first surrounding portion and a second protruding portion formed on the first protruding portion;
   polishing the second protruding portion of the electromagnetic shielding layer and the first protruding portion of the blocking layer to expose the shading block;
   removing the shading block from the IR-cut filter to form an optical component, the optical component comprising an IR-cut filter portion formed by the IR-cut filter and a barrel portion cooperatively formed by the first surrounding portion and the second surrounding portion;
   mounting a lens in the barrel portion adjacent to the IR-cut filter portion; and
   packaging the holding portion of the optical component to a printed circuit board to form the lens module.

2. The method of claim 1, wherein the formation of the IR-cut filter comprises depositing a IR-cut film on a surface of a transparent substrate.

3. The method of claim 1, wherein the formation of the IR-cut filter comprises depositing a IR-cut film on a surface of each transparent substrate, and fixing a plurality of transparent substrates together.

4. The method of claim 1, wherein the formation of the shading block on part of the surface of the IR-cut filter comprises discharging a droplet of ceramic powder in a liquid phase on the part of the surface of the IR-cut filter, and drying the droplet to form the shading block.

5. The method of claim 4, wherein the shading block consists essentially of aluminophosphate and silica.

6. The method of claim 1, wherein the formation of the blocking layer on the IR-cut filter and the shading block comprises sputter depositing a CrN layer on the IR-cut filter and the shading block to form the blocking layer.

7. The method of claim 1, wherein the formation of an electromagnetic shielding layer on the blocking layer comprises sputter depositing a copper layer on the blocking layer to form the electromagnetic shielding layer.

8. The method of claim 1, further comprising forming an anti-oxidation layer on the electromagnetic shielding layer following the formation of the electromagnetic shielding layer on the blocking layer, wherein the anti-oxidation layer comprises a third surrounding portion formed on the second surrounding portion and a third protruding portion formed on the second protruding portion; the barrel portion is cooperatively formed by the first surrounding portion, the second surrounding portion, and the third surrounding portion.

9. The method of claim 8, wherein the anti-oxidation layer consists essentially of stainless steel.

10. The method of claim 9, wherein formation of the anti-oxidation layer on the electromagnetic shielding layer comprises sputter depositing a stainless steel layer on the electromagnetic shielding layer to form the anti-oxidation layer.

11. The method of claim 1, wherein removal of the shading block from the IR-cut filter is accomplished by dissolving the shading block using water.

* * * * *